United States Patent
Kuo et al.

(10) Patent No.: US 6,924,708 B2
(45) Date of Patent: Aug. 2, 2005

(54) OSCILLATOR CIRCUIT HAVING AN EXPANDED OPERATING RANGE

(75) Inventors: Yao H. Kuo, West Bloomfield, MI (US); Sylvester P. Porambo, Canton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 319 days.

(21) Appl. No.: 10/241,339

(22) Filed: Sep. 11, 2002

(65) Prior Publication Data

US 2004/0046617 A1 Mar. 11, 2004

(51) Int. Cl.[7] .............................. H03B 5/06; H03B 5/08; H03B 5/12
(52) U.S. Cl. ............... 331/108 R; 331/109; 331/117 R; 331/173; 331/183
(58) Field of Search .............................. 331/108 R, 109, 331/116 R, 116 FE, 117 R, 117 FE, 182, 183

(56) References Cited

U.S. PATENT DOCUMENTS

| | | |
|---|---|---|
| 4,282,496 A | 8/1981 | Heuner |
| 4,387,350 A | 6/1983 | Bessolo et al. |
| 4,445,064 A | 4/1984 | Bullis |
| 4,613,829 A | 9/1986 | Ott |
| 4,896,122 A | 1/1990 | Tahernia et al. |
| 4,956,618 A | 9/1990 | Ulmer |
| 5,184,094 A | 2/1993 | Kohler |
| 5,486,795 A | 1/1996 | Spence et al. |
| 5,534,826 A | 7/1996 | Logan |
| 5,548,252 A | 8/1996 | Watanabe et al. |
| 5,719,534 A | 2/1998 | Imura |
| 5,770,980 A | 6/1998 | Barrett, Jr. et al. |
| 5,894,248 A | 4/1999 | Bedard |
| 5,920,236 A | 7/1999 | Ishizaki |
| 5,923,222 A | 7/1999 | Russell et al. |
| 6,025,757 A * | 2/2000 | Tsukagoshi et al. ........ 331/158 |
| 6,169,462 B1 | 1/2001 | White |
| 6,340,920 B1 | 1/2002 | Tseng |

* cited by examiner

*Primary Examiner*—David Mis
(74) *Attorney, Agent, or Firm*—Scott M. Confer

(57) ABSTRACT

An oscillator circuit having an expanded operating range includes an amplifier portion amplifying an oscillating signal. A gain controlling portion controls the gain of the amplified oscillating signal. A switching circuit electrically connected across the gain controlling portion provides a low impedance electrical path in parallel with the gain controlling portion in response to a switch input signal. The switching circuit further includes a switch signal generator portion producing the switch input signal to switch the switching circuit ON or OFF when power supplied to the oscillator circuit reaches a first predetermined voltage level and to switch the switching circuit OFF or ON when power supplied to the oscillator circuit reaches a second predetermined voltage level. In this circuit design, the initiation of an oscillating signal by the oscillator circuit is unaffected by supply voltage variation or, in other words, fluctuation in the power supplied to the oscillator circuit.

17 Claims, 3 Drawing Sheets

OSCILLATOR CIRCUIT HAVING AN EXPANDED OPERATING RANGE

BACKGROUND OF THE INVENTION

The present invention relates to oscillator circuits and, in particular, to an oscillator circuit having an expanded operating range.

An oscillator circuit consists of at least two parts: 1) an amplifying portion (e.g., a transistor) that will produce power gain; and 2) a feedback portion that determines the operating frequency. To control the gain and establish the operating point, an impedance (e.g., a resistor) may be connected in series with the amplifying portion. The addition of such impedance causes an increase in the start-up time required for the oscillator to reach a stable rate of oscillation. The impedance decreases the gain of the amplifying portion and increases the minimum supply voltage needed to initiate oscillations.

To ensure oscillator initiation, prior art oscillator circuits have taught that the supply voltage and/or loop gain may be momentarily increased during start-up. It has been learned that once oscillations are initiated, the supply voltage and/or loop gain may be reduced while oscillations are sustained. However, continuous operation at a high loop gain creates energy radiation or electromagnetic interference (EMI) as well as distortion while continuous operation at a high supply voltage increases the power dissipation of the oscillator.

To add further complication, oscillator initiation is also affected by supply voltage variation or, in other words, fluctuation in the power supplied to the oscillator. For example, in automotive electrical architectures the power supplied by the battery may vary the supply voltage between 9 volts and 16 volts. The operation of prior art oscillator circuits is affected by supply voltage variation. Accordingly, there is a desire to provide an oscillator circuit which overcomes the shortcomings of the prior art.

SUMMARY OF THE INVENTION

The present invention provides an oscillator circuit having an expanded operating range including an amplifier portion amplifying an oscillating signal. A gain controlling portion controls the gain of the amplified oscillating signal. A switching circuit electrically connected across the gain controlling portion provides a low impedance electrical path in parallel with the gain controlling portion in response to a switch input signal. The switching circuit further includes a switch signal generator portion producing the switch input signal to switch the switching circuit ON or OFF when power supplied to the oscillator circuit reaches a first predetermined voltage level and to switch the switching circuit OFF or ON when power supplied to the oscillator circuit reaches a second predetermined voltage level. In this circuit design, the initiation of an oscillating signal by the oscillator circuit is unaffected by supply voltage variation or, in other words, fluctuation in the power supplied to the oscillator circuit.

Further scope of applicability of the present invention will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The present invention will become more fully understood from the detailed description given here below, the appended claims, and the accompanying drawings in which:

DETAILED DESCRIPTION OF THE PREFERRED EMBODIMENT

Figure 1:
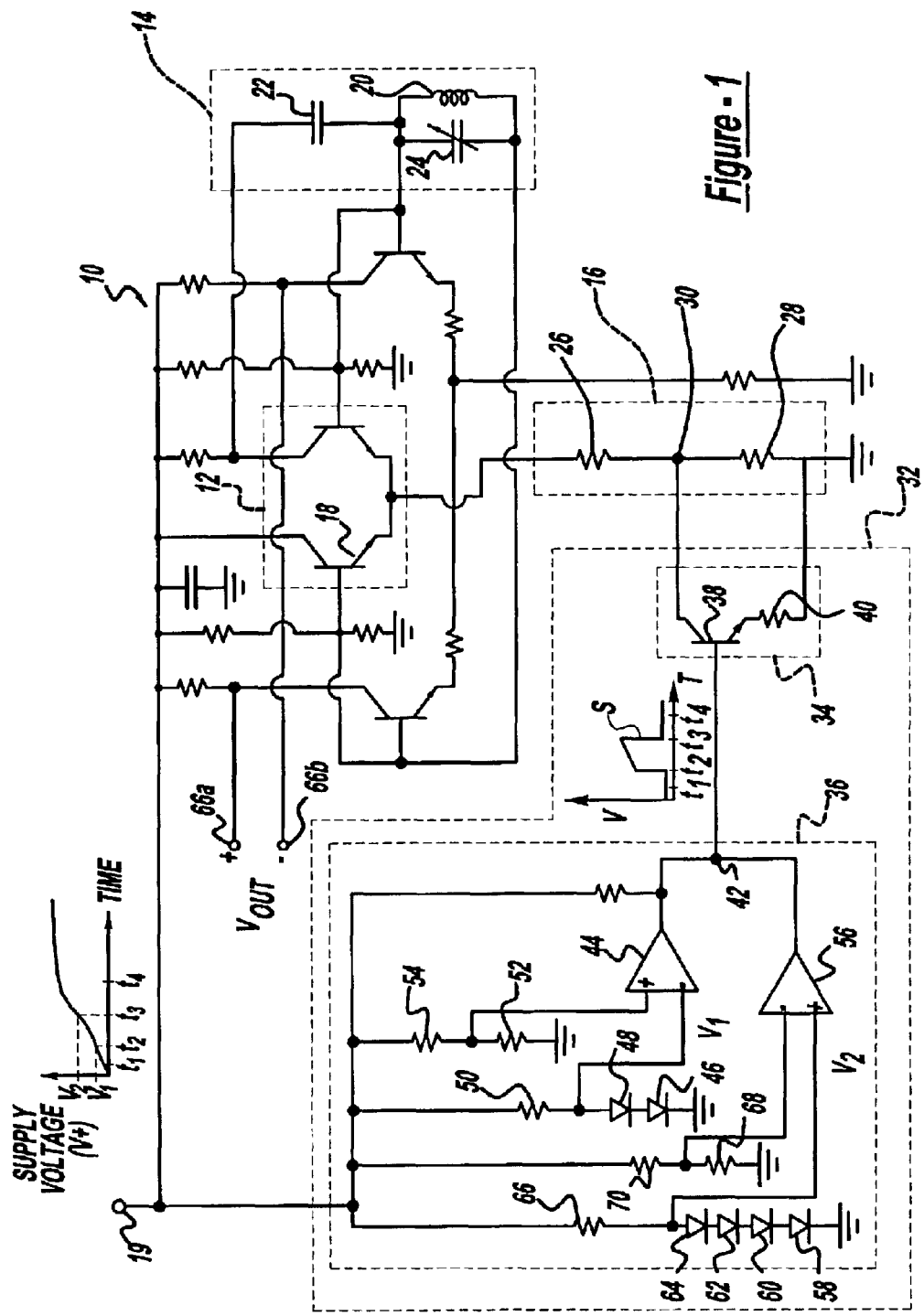
FIG. 1 is an electrical schematic of an oscillator circuit in accordance with the present invention.

FIG. 1 is an electrical schematic of an oscillator circuit 10 in accordance with the present invention. The oscillator circuit 10 includes several conventional components including an amplifier portion 12, a feedback portion 14, and a gain controlling portion 16. The amplifier portion 12 is designed to amplify an input signal or, in other words, produce a signal gain. The amplifier portion 12 includes a transistor 18. The collector electrode of the amplifying transistor 18 receives power in the form of supply voltage V+ from an external power supply (not shown) at a power input terminal 19. A graph of the supply voltage V+ at start-up is included in FIG. 1 adjacent to the power input terminal 19 (for greater detail, see FIG. 2). The base electrode of the amplifying transistor 18 is electrically connected in series to the output of the feedback portion 14. The emitter electrode of the amplifying transistor 18 is electrically connected in series to the gain controlling portion 16. The feedback portion 14 is designed to establish the operating frequency. The feedback portion 14 includes a coil 20 and two capacitors 22 and 24. Because the feedback portion 14 is comprised of the coil 20 and the two capacitors 22 and 24, this type of oscillator circuit 10 is by definition referred to as an LC oscillator. The gain controlling portion 16 is designed to control the gain and establish the operating point. The gain controlling portion 16 is electrically connected in series between the emitter of the amplifying transistor 18 and ground. The gain controlling portion 16 includes two resistors 26 and 28. Specifically, the first resistor 26 is electrically connected in series between the emitter of the amplifying transistor 18 and node 30 while the second resistor 28 is electrically connected in series between node 30 and ground.

The oscillator circuit 10 also includes a switching circuit 32 having a low impedance electrical path 34 and a switch signal generator portion 36. The low impedance electrical path 34 includes a transistor 38, operating as a switching means, and a resistor 40, providing low impedance. The low impedance electrical path 34 is electrically connected between node 30 and ground or, in other words, the low impedance electrical path 34 is electrically connected across or in parallel with the second resistor 28. The collector electrode of switching transistor 38 is electrically connected to node 30. The resistor 40 is electrically connected in series between the emitter electrode of the switching transistor 38 and ground. The base electrode of the switching transistor 38 is electrically connected to the output of the switch signal generator portion 36.

The switch signal generator portion 36 provides a switch input signal S at node 42. A graph of the switch input signal S at start-up is illustrated in FIG. 1 adjacent to the base electrode of the switching transistor 38. The switch signal generator portion 36 includes a first comparator 44 which, in combination with the electrical configuration of two diodes 46 and 48 and three resistors 50, 52, and 54, establishes a first predetermined voltage level $V_1$ of the supply voltage V+ at which the switch input signal S steps-up or, in other words, goes HIGH. The switch signal generator portion 36 also includes a second comparator 56 which, in combination with the electrical configuration of four diodes 58, 60, 62, and 64 and three resistors 66, 68, and 70, establishes a second predetermined voltage level $V_2$ of the supply voltage V+ at which the switch input signal S steps-down or, in other words, goes LOW. This switch signal generator portion 36 is designed to provide a HIGH switch input signal when the supply voltage V+ is between approximately 1.4 volts and 2.8 volts (thus, $V_1$=1.4V and $V_2$=2.8V). The first and second predetermined voltage levels $V_1$ and $V_2$ can be adjusted. Increasing the number of diodes electrically connected in series between the negative (−) input of the first comparator 44 and ground would increase the first predetermined voltage level $V_1$ and decreasing the number of diodes electrically connected in series between the negative (−) input of the first comparator 44 and ground would decrease the first predetermined voltage level $V_1$. Likewise, increasing the number of diodes electrically connected in series between the positive (+) input of the second comparator 56 and ground would increase the second predetermined voltage level $V_2$ and decreasing the number of diodes electrically connected in series between the positive (+) input of the second comparator 56 and ground would decrease the second predetermined voltage level $V_2$. Within the spirit and scope of the present invention, it is recognized that other known electrical circuits, which produce a signal that can be adapted to turn a switch from ON to OFF or OFF to ON respectively at a first predetermined voltage level of the supply voltage and from OFF to ON or ON to OFF respectively at a second predetermined voltage level of the supply voltage, may be used as the switch signal generator. The oscillator circuit 10 produces an output $V_{out}$ at output terminals 66a and 66b.

Figure 2:
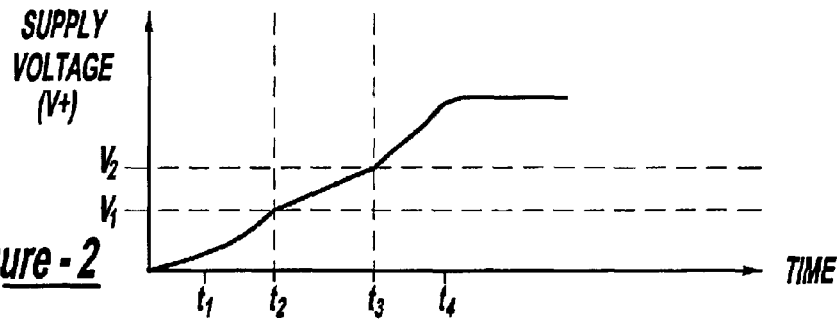
FIG. 2 is a graph illustrating the supply voltage (V+) of the oscillator circuit at start-up.
Figure 3:
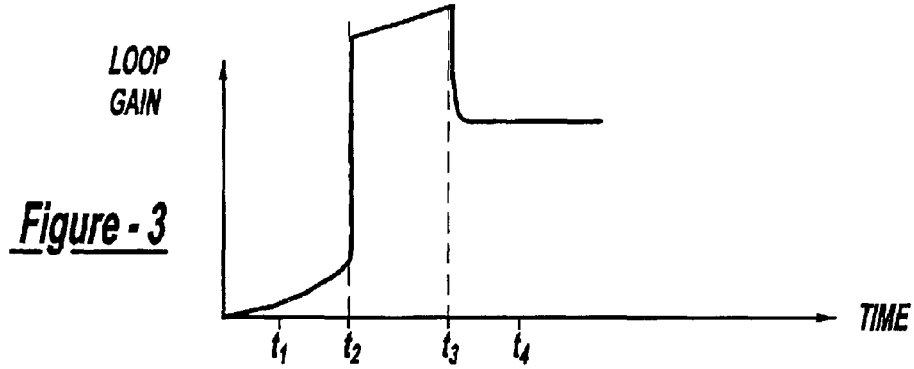
FIG. 3 is a graph illustrating the loop gain of the oscillator circuit at start-up.
Figure 4:
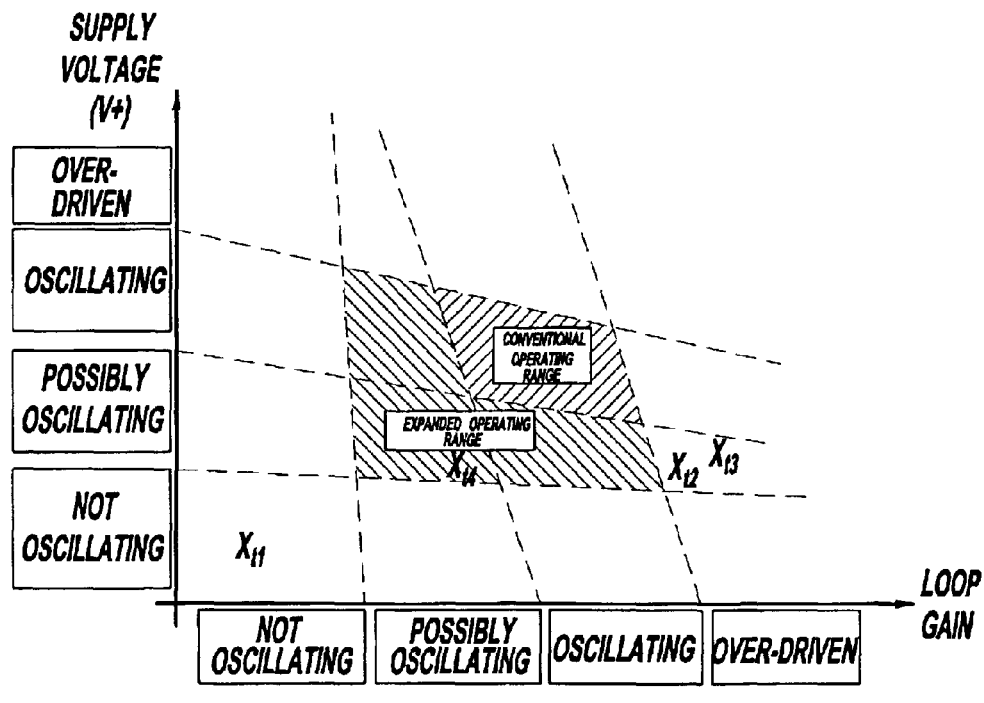
FIG. 4 is a graph illustrating both the conventional operating range and an expanded operating range of the oscillator circuit.
Figure 5:
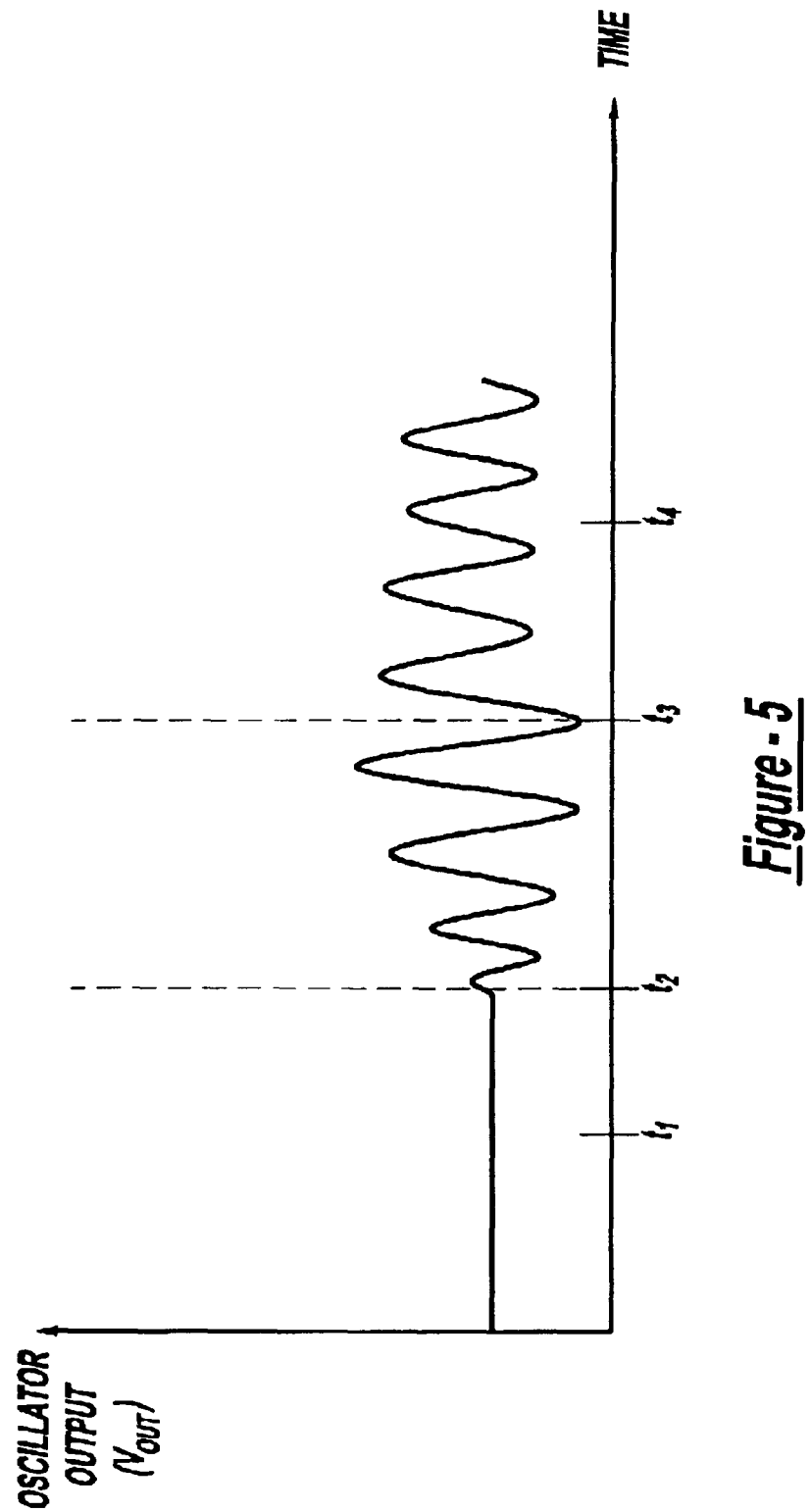
FIG. 5 is a graph illustrating the oscillator output $V_{out}$ at start-up.

The operation of the oscillator circuit 10 at start-up is further described with reference to FIGS. 2–5. FIG. 2 is a graph of the supply voltage (V+) versus time at the start-up of the oscillator circuit 10. FIG. 3 is a graph of the loop gain versus time at the start-up of the oscillator circuit 10. FIG. 4 is a graph of the supply voltage (V+) versus loop gain of oscillator circuit 10 illustrating both the conventional operating range and an expanded operating range as well as the operating regions (Not Oscillating, Possibly Oscillating, Oscillating, and Over-Driven). The Possibly Oscillating operating region is defined as such because an oscillator circuit having an operating point which moves directly through the Not Oscillating operating region (where both the supply voltage and loop gain are not great enough to initiate oscillations) to the Possibly Oscillating operating region may or may not initiate oscillations based on supply voltage variations and temperature stresses. Additionally, the operating point of the oscillator circuit 10 at start-up times $t_1$, $t_2$, $t_3$, and $t_4$ are also identified in FIG. 4. FIG. 5 is a graph illustrating the oscillator output $V_{out}$ at start-up.

At start-up time $t_1$, an increasing supply voltage V+ is applied to the oscillator circuit 10 (see FIG. 2). Simultaneously, the switch signal generator portion 36 is transmitting a LOW switch input signal S to the low impedance electrical path 34 thereby operating the switching transistor 38 in a non-conducting or OFF condition. As a result, only a slightly increasing loop gain is realized (see FIG. 3) by the oscillator circuit 10. At this time, the operating point $X_{t1}$ of the oscillator circuit 10 is located in the Not Oscillating operating region (see FIG. 4) and the oscillator output $V_{out}$ is not oscillating (see FIG. 5).

At start-up time $t_2$, the increasing supply voltage V+ reaches the first predetermined voltage level $V_1$, selected to correspond with the minimum voltage required to initiate oscillations (see FIG. 2). Simultaneously, the switch signal generator portion 36 transmits a HIGH switch input signal S to the low impedance electrical path 34 thereby switching the operation of the switching transistor 38 to a conducting or ON condition. The decrease in impedance between the amplifying transistor 18 and ground results in a large increase in the loop gain (see FIG. 3) of the oscillator circuit 10. At this time, the operating point $X_{t2}$ of the oscillator circuit 10 moves from the Not Oscillating operating region to the Over-Driven operating region (see FIG. 4) and the oscillator output $V_{out}$ begins to oscillate significantly (see FIG. 5).

At start-up time $t_3$, the increasing supply voltage V+ reaches the second predetermined voltage level $V_2$ (see FIG. 2). Simultaneously, the switch signal generator portion 36 transmits a LOW switch input signal S to the low impedance electrical path 34 thereby switching the operation of the switching transistor 38 back to a non-conducting or OFF condition. As a result, a decrease in the loop gain is realized (see FIG. 3) by the oscillator circuit 10. Between start-up times $t_2$ and $t_3$, the operating point $X_{t3}$ of the oscillator circuit 10 remains in the Over-Driven operating region (see FIG. 4) momentarily producing the undesirable effects of energy radiation or electromagnetic interference (EMI) as well as distortion. Between start-up times $t_2$ and $t_3$, the oscillator output $V_{out}$ realizes large oscillations (see FIG. 5). By providing a low impedance path between the amplifying transistor 18 and ground, the operating point of the oscillator circuit 10 is intentionally and momentarily driven into the Over-Driven operating region to ensure initiation of oscillations.

Once oscillations are initiated, the loop gain may be reduced while oscillations are sustained. Accordingly, at start-up time $t_4$, the supply voltage V+ reaches a relatively constant level (see FIG. 2). The switch signal generator portion 36 continues to transmits a LOW switch input signal S to the low impedance electrical path 34 thereby operating of the switching transistor 38 in the non-conducting or OFF condition. The loop gain stabilizes to a steady rate (see FIG. 3). Between start-up times $t_3$ and $t_4$, the operating point $X_{t4}$ of the oscillator circuit 10 is moved back through the Oscillating operating region to the Possibly Oscillating operating region (see FIG. 4) thereby reducing the undesirable effects of EMI and distortion. The range in which the oscillator circuit 10 can reliably operate now further includes the Expanded Operating Range identified in FIG. 4. Operating the oscillator circuit 10 in the Expanded Operating Range, instead of the Conventional Operating Range, further reduces the amount of EMI, distortion, and power dissipation.

In this circuit design, the operating point of the oscillator 10 is switched into and out of the Over-Driven operating range at selected first and second voltage levels $V_1$ and $V_2$ respectively which are independent of the instant supply voltage and, thus, unaffected by supply voltage variation. The operation of the oscillator circuit 10 once oscillation is initiated is known and need not be detailed. Although the oscillator circuit 10 illustrated in FIG. 1 is configured as a LC oscillator, within the spirit and scope of the present invention any type of oscillator circuit having a gain controlling portion may be used.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. An oscillator circuit, comprising:
   an amplifier portion amplifying an oscillating signal;
   a gain controlling portion controlling the gain of the amplified oscillating signal;
   a switching circuit electrically connected across the gain controlling portion for providing a low impedance electrical path in parallel with the gain controlling portion in response to a switch input signal, said switching circuit including a switch signal generator portion producing the switch input signal to switch the switching circuit ON when power supplied to the oscillator circuit reaches a first predetermined voltage level and to switch the switching circuit OFF when power supplied to the oscillator circuit reaches a second predetermined voltage level, and wherein the switch signal generator portion includes first and second comparators establishing the first and second predetermined voltage levels.

2. The oscillator circuit of claim 1, wherein the switch input signal switches the switching circuit from one ON/OFF state to another ON/OFF state when power supplied to the oscillator circuit reaches said first predetermined voltage level.

3. The oscillator circuit of claim 2, wherein the switch input signal switches the switching circuit from said another ON/OFF state when power supplied to the oscillator circuit reaches said second predetermined voltage level.

4. The oscillator circuit of claim 1, wherein the low impedance path of the switching circuit is electrically connected in parallel with at least part of the gain controlling portion.

5. The oscillator circuit of claim 1, wherein the switching circuit further includes a transistor operated as a switch and electrically connected in parallel with the gain controlling portion.

6. The oscillator circuit of claim 5, wherein the switching circuit further includes a resistor electrically connected in series to the transistor with the series transistor and resistor electrically connected in parallel with the gain controlling portion.

7. The oscillator circuit of claim 1, further including a feedback portion including a coil and a capacitor.

8. An oscillator circuit comprising:
   an amplifier portion amplifying an oscillating signal;
   a gain controlling portion controlling the gain of the amplified oscillating signal;
   a feedback portion including a coil and a capacitor;
   a switching circuit electrically connected across the pain controlling portion for providing a low impedance electrical path in parallel with the pain controlling portion in response to a switch input signal, said switching circuit including a switch signal generator portion producing the switch input signal to switch the switching circuit ON when power supplied to the oscillator circuit reaches a first predetermined voltage level and to switch the switching circuit OFF when power supplied to the oscillator circuit reaches a second predetermined voltage level, and wherein said switch signal generator portion includes first and second comparators establishing the first and second predetermined voltage levels.

9. The oscillator circuit of claim 8, wherein the switch input signal switches the switching circuit from one ON/OFF state to another ON/OFF state when power supplied to the oscillator circuit reaches said first predetermined voltage level.

10. The oscillator circuit of claim 8, wherein the switch input signal switches the switching circuit from said another ON/OFF state when power supplied to the oscillator circuit reaches said second predetermined voltage level.

11. The oscillator circuit of claim 8, wherein the low impedance path of the switching circuit is electrically connected in parallel with at least part of the gain controlling portion.

12. The oscillator circuit of claim 8, wherein the switching circuit further includes a transistor operated as a switch and electrically connected in parallel with the gain controlling portion.

13. The oscillator circuit of claim 12, wherein the switching circuit further includes a resistor electrically connected in series to the transistor with the series transistor and resistor electrically connected in parallel with the gain controlling portion.

14. An oscillator circuit comprising:
   an amplifier portion comprising an input, an output, and a third terminal;
   a gain controlling portion operably connected between said third terminal of said amplifier portion and ground potential;
   a feedback portion operably connected between said input and said output of said amplifier portion;
   a switching circuit having a first, a second and a third terminal, wherein said first terminal is operably connected to said gain controlling portion and said second terminal is operably connected to ground potential; and
   a switch signal generator portion having an output operably connected to said third terminal of said switching circuit, wherein said switch signal generator includes a first comparator and a second comparator, wherein said first comparator includes a first input operably connected to a first predetermined voltage level, a second input and an output, and wherein said second comparator includes a first input, a second input operably connected to a second predetermined voltage level and an output.

15. The oscillator circuit according to claim 14, wherein said second input of said first comparator is operably connected to a supply voltage and said output of said first comparator, and wherein said first input of said second comparator includes is operably connected to said supply voltage, and said output of said second comparator is operably connected to said output of said first comparator.

16. The oscillator circuit according to claim 14, wherein said feedback portion includes a first capacitor operably connected in series with a parallel combination of a coil and a second capacitor.

17. The oscillator circuit according to claim 15, wherein said feedback portion includes a first capacitor operably connected in series with a parallel combination of a coil and a second capacitor.

* * * * *

UNITED STATES PATENT AND TRADEMARK OFFICE
CERTIFICATE OF CORRECTION

PATENT NO. : 6,924,708 B2　　　　　　　　　　　　　　　　　　　　　　　Page 1 of 1
DATED : August 2, 2005
INVENTOR(S) : Yao H. Kuo et al.

It is certified that error appears in the above-identified patent and that said Letters Patent is hereby corrected as shown below:

Column 5,
Lines 59 and 61, "pain" should be -- gain --.

Signed and Sealed this

Twentieth Day of September, 2005

JON W. DUDAS
*Director of the United States Patent and Trademark Office*